United States Patent
Verbruggen et al.

(10) Patent No.: US 8,957,794 B2
(45) Date of Patent: Feb. 17, 2015

(54) A/D CONVERTER AND METHOD FOR CALIBRATING THE SAME

(71) Applicants: IMEC, Leuven (BE); Renesas Electronics Corporation, Kanagawa (JP)

(72) Inventors: Bob Verbruggen, Kessel-lo (BE); Masao Iriguchi, Kanagawa (JP); Jan Craninckx, Boutersem (BE)

(73) Assignees: IMEC, Leuven (BE); Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/767,233

(22) Filed: Feb. 14, 2013

(65) Prior Publication Data
US 2013/0214946 A1 Aug. 22, 2013

(30) Foreign Application Priority Data
Feb. 16, 2012 (EP) .................................. 12155784

(51) Int. Cl.
- *H03M 1/06* (2006.01)
- *H03M 1/10* (2006.01)
- *H03M 1/14* (2006.01)
- *H03M 1/46* (2006.01)

(52) U.S. Cl.
CPC .............. *H03M 1/06* (2013.01); *H03M 1/1023* (2013.01); *H03M 1/145* (2013.01); *H03M 1/466* (2013.01)
USPC ............................................ 341/118; 341/120

(58) Field of Classification Search
USPC .................... 341/118, 120, 161, 162, 163, 172
See application file for complete search history.

(56) References Cited

U.S. PATENT DOCUMENTS

| 2009/0121907 A1* | 5/2009 | Kuramochi et al. .......... 341/120 |
| 2010/0214140 A1 | 8/2010 | Reinhold et al. |
| 2012/0249348 A1* | 10/2012 | Siragusa ...................... 341/110 |

FOREIGN PATENT DOCUMENTS

| EP | 2280486 A1 | 2/2011 |
| KR | 20110072203 A | 6/2011 |

OTHER PUBLICATIONS

Chun-Cheng Liu et al., A 10-bit 50-MS/s SAR ADC With a Monotonic Capacitor Switching Procedure, IEEE Journal of Solid-State Circuits, vol. 45, No. 4, Apr. 2010 pp. 731-740.*

(Continued)

*Primary Examiner* — Howard Williams
(74) *Attorney, Agent, or Firm* — McDonnell Boehen Hulbert & Berghoff LLP

(57) ABSTRACT

An ADC includes sampling means for sampling an input voltage signal, comparator(s) for receiving the sampled signal, and a DAC including circuitry for generating a search signal approximating the input signal and a calibration signal. The search signal and the calibration signal are to be applied to a comparator. The ADC also includes a search logic block for receiving a comparator output signal, for providing input to the DAC for generating the search signal, and for producing a digital output signal. Further, the ADC includes a calibration logic block for producing a control signal to control the circuitry of the DAC and including processing means for observing the output signal, for comparing the output signal with a desired output, and for compensating analog non-idealities of the ADC. The DAC circuitry is adapted for generating the calibration signal in accordance with the control signal and with the sampled input signal.

10 Claims, 5 Drawing Sheets

(56) References Cited

OTHER PUBLICATIONS

Yan Zhu et al., A 35 fJ 10b 160 MS/s Pipelined-SAR ADC with Decoupled Flip-Around MDAC and Self-Embedded Offset Cancellation, IEEE Asian Solid-State Circuits Conference Nov. 14-16, 2011, pp. 61-64.*

European Search Report, European Patent Application No. 12155784.7 dated Oct. 1, 2012.

Kostas, Doris, et al., "A 480 mW 2.6 GS/s 10b Time-Interleaved ADC With 48.5 dB SNDR up to Nyquist in 65 nm CMOS", IEEE Journal of Solid-State Circuits, vol. 46, No. 12, Dec. 2011, pp. 2821-2833.

Huang, Xuan-Lun et al., "A Self-Testing and Calibration Method for Embedded Successive Approximation Register ADC", Design Automation Conference (ASP-DAC), 2011, 16th Asia and South Pacific, IEEE, Jan. 25, 2011, pp. 713-718.

Huang, X.L. et al., "A Self-Testing and Calibration Method for Embedded Successive Approximation Register ADC", Laboratory of Dependable Systems, Industrial Technology Research Institute, ASPDAC 2011, pp. 1-33.

Louwsma, Simon M. et al., "A 1.35 GS/s, 10b, 175 mW Time-Interleaved AD Converter in 0.13 um CMOS", IEEE Journal of Solid-State Circuits, vol. 43, No. 4, Apr. 2008, pp. 778-786.

Huang, Xuan-Lun et al., "A Pre- and Post-Bond Self-Testing and Calibration Methodology for SAR ADC Array in 3-D CMOS Imager", Sixteenth IEEE European Test Symposium, IEEE Computer Society, 2011, pp. 39-44.

* cited by examiner

A/D CONVERTER AND METHOD FOR CALIBRATING THE SAME

CROSS-REFERENCE TO RELATED APPLICATION

This application claims priority to European Patent Application No. 12155784.7 filed on Feb. 16, 2012, the contents of which are hereby incorporated by reference.

TECHNICAL FIELD

The present disclosure is related to the field of analogue-to-digital converters.

BACKGROUND OF THE RELATED TECHNOLOGY

In recent years, great advances have been made in increasing the power efficiency of analogue-to-digital converters. Currently, the most efficient implementations are based on a successive approximation register (SAR) architecture.

In a typical successive approximation register analogue-to-digital conversion (SAR ADC) architecture the input $V_{in}$ is compared against a digital-to-analogue converter (DAC) output $V_A$ using a comparator in several cycles. The input first goes through a sample and hold block. The SAR search logic block executes a search algorithm, which typically performs a binary search. In the first cycle the input is compared against the middle of the ADC range. From the comparator output the most significant bit (MSB) can be determined. In the next cycle MSB-1 is determined. A conversion to n bits requires n cycles. The SAR ADC is low in cost and consumes low operating power. The excellent power efficiency of the SAR converter can be attributed both to the inherent efficiency of the binary search algorithm and the simplicity of the required hardware.

A conventional SAR ADC scheme is depicted in FIG. 1. A sample and hold circuit is included, as well as a comparator, a DAC and a digital SAR controller. The analogue signal $V_{in}$ enters the sample and hold (S/H) circuit where the signal simply is sampled and held to provide a buffer for the A/D converter. $V_{in}$ is compared in the comparator to comparator reference voltage $V_{ref}$. The digital comparison result goes to the SAR controller block comprising the search logic. The controller block adjusts the digital control signals in order to narrow the compared voltages. An adjusted digital signal is outputted to a digital-to-analogue converter (DAC). This signal is converted to an adjusted $V_{ref}$ which is compared to $V_{in}$ in the comparator. A common implementation of the DAC uses an array of capacitors which are controlled by the SAR controller block.

Digital calibration is applied to measure and compensate for analogue imperfections in these SAR A/D converters. The analogue imperfections to be mitigated through digital calibration are typically located in the DAC (in order to achieve linearity) and the comparator (to compensate offset).

Digital calibration of comparator offset can be achieved by sampling a zero input voltage, which is then applied to the comparator input. Based on the comparator outputs, the comparator offset can then be inferred and minimized. The reference voltage for the calibration is simply the zero input voltage, which does not require dedicated circuitry to generate. This is illustrated for a differential implementation in FIG. 2, where a DAC implementation with an array of capacitors as previously mentioned can be seen.

Digital calibration of the DAC linearity has been applied in the art to a number of different DAC implementations in order to compensate for various non-idealities, such as capacitor mismatch, parasitic capacitance, etc. All of these calibration steps share the same three fundamental steps. First, the ADC samples a zero input voltage, such that the comparator input is also zero. Next, the DAC is switched such that any DAC error is generated at the comparator input. Finally, the comparator output is observed to determine the polarity of the DAC error. Again, the reference voltage for this calibration is simply a zero input voltage, which again does not require dedicated circuitry to generate. This is illustrated for the case of MSB mismatch calibration in FIG. 3.

Recent implementations of SAR ADCs have departed from the conventional implementation of FIG. 1, usually with the goal of further improving power efficiency. One option is to use a specific, different comparator in each step of the binary search, and a differential DAC that changes its output common mode as well as its differential mode, as shown in FIG. 4.

At the start of a conversion, the input voltage is sampled and the first comparator is activated. If this comparator decides its input is positive, the MSB capacitance of the DAC connected to the positive comparator input is switched from the reference to ground, reducing the differential comparator input by VstepMSB and lowering the comparator input common-mode by VstepMSB/2, as shown on the right in FIG. 4. If, on the other hand, the comparator decides the input is negative, the other MSB capacitance is switched, lowering instead node comp–. As was the case for a positive comparator output, the common-mode of the comparator input is lowered by VstepMSB/2. The common-mode of the comp+ and comp– signals is thus independent of the comparator decisions. An appropriate time after the first comparator decision (whereby 'appropriate' means allowing enough time for the DAC output to settle), the second comparator is activated and the process is repeated for all lower order bits.

One potential advantage of always switching the DAC from reference to ground, and never from ground to reference, is that all DAC settling occurs through an NMOS rather than PMOS switch, which benefits settling speed. One potential disadvantage of this arrangement is the changing common-mode level of the comparator input, which can result in comparator errors due to common-mode dependent comparator offset. This drawback can be solved by implementing a dedicated comparator for each step of the binary search. Indeed, since each comparator is only activated in a specific cycle and the common-mode comparator input in a specific cycle is well known and independent of the preceding comparator decisions, each comparator is only ever activated at a specific common-mode input. By calibrating each comparator offset at its specific common-mode input voltage level, the problem of common-mode dependent comparator offset can thus be avoided.

A straightforward way to calibrate such comparator offsets is to sample a zero differential input voltage of the correct common-mode, which is then applied to the comparator in question. By observing this comparator's output, offset can be inferred and minimized. However, in this approach, each comparator in the converter requires a specific calibration reference: a zero differential input voltage of a specific common-mode voltage. Indeed, if the nominal ADC operates with a common-mode input voltage of $V_{cm}$, zero differential inputs at $V_{cm}$ (first comparator), $V_{cm}$–VstepMSB/2 (second comparator), $V_{cm}$–3*VstepMSB/4 (third comparator) etc. are required. To generate these signals, a specific calibration DAC would be required, at the cost of valuable circuit area, design time and power consumption. FIG. 5 provides an illustration of this drawback.

In the paper "A Self-Testing and Calibration Method for Embedded Successive Approximation Register ADC" (Xuan-Lun Huang et al., Asia and South-Pacific Design Automation Conference (ASP-DAC) 2011, January 2011, pp. 713-718) a low cost design-for-test technique is proposed which tests a SAR ADC by characterizing its DAC capacitor array. Direct control of the DAC capacitor array is proposed to generate the required DAC major carrier transitions and measure them by an integrated ADC comprising the comparator of the SAR ADC and an additional design-for-test DAC. Then a fully-digital missing code calibration technique is developed that utilizes the testing scheme to collect calibration information. More particularly, the main SAR DAC capacitor array is switched to generate an error voltage and the additional test DAC is used to quantize the error. The proposed arrangement is not suited for generating calibration references, since the DAC itself is assumed to be inaccurate.

Application US2010/214140 relates to digital trimming of SAR ADCs. A SAR ADC is provided that performs error correction in order to reduce cost. This is accomplished by adding correction capacitors that can correct for DAC non-linearity. It is not specified how said DAC non-linearity is measured. The proposed arrangement is not suited for generating calibration references since the DAC itself is assumed to be inaccurate.

In the paper "A 480 mW 2.6 GS/s 10 b Time-Interleaved ADC With 48.5 dB SNDR up to Nyquist in 65 nm CMOS" (Kostas Doris et al., IEEE Journal of Solid-State Circuits vol. 46, no. 12, December 2011), calibration is used to compensate inter-channel gain and offset mismatch as well as DAC non-linearity. Off-chip references are used for channel gain and offset calibration, the DAC linearity is measured by comparing each consecutive MSB to the sum of its LSBs. Again the proposed arrangement is not suited for generating calibration references since the DAC itself is assumed to be inaccurate.

Hence, it is desirable to find a way to overcome the need to use dedicated equipment to generate specific calibration reference signals.

SUMMARY OF THE DISCLOSURE

Embodiments of the present disclosure are configured to provide a solution that is capable of generating calibration reference signals whereby it is not needed to have a specific external calibration reference signal for each comparator.

Generally, this is accomplished by an A/D converter and method according to the present disclosure.

In a first aspect, the disclosure relates to an analogue-to-digital converter for converting an input voltage signal into a digital output signal representing the input voltage signal. The analogue-to-digital converter includes sampling means for sampling the input voltage signal, one or more comparators arranged for receiving said sampled input voltage signal, a digital-to-analogue converter (DAC) comprising circuitry adapted for generating a search signal approximating the input voltage signal and a calibration signal. The search signal and the calibration signal are to be applied to a comparator of the one or more comparators. The analogue-to-digital converter also includes a search logic block arranged for receiving a comparator output signal from the one or more comparators, for providing input to the DAC for generating the search signal, and for producing a digital output signal. Further, the analogue-to-digital converter includes a calibration logic block adapted for producing a control signal to control the circuitry of the DAC and comprising processing means for observing the digital output signal and for comparing the digital output signal with a desired output and for compensating analogue non-idealities of the analogue-to-digital converter, whereby the circuitry of the DAC is adapted for generating the calibration signal in accordance with the control signal and with the sampled input voltage signal.

The proposed A/D converter indeed avoids the need for creating a specific calibration reference signal for each comparator. Instead it exploits a D/A converter present inside the A/D converter in many A/D converter types (e.g. a successive approximation A/D converter or a pipeline A/D converter) to assist in generating the calibration reference signals. The calibration reference signals applied to the comparator can be used for calibrating various analogue non-idealities, as will be described in detail below.

A known voltage signal applied at the input is sampled. The calibration logic block outputs a control signal that is fed to a circuit in the DAC. That circuit generates a suitable calibration signal based on the control signal and the sampled input voltage signal. This calibration signal then goes to a comparator of the analogue-to-digital converter, where it can be used for calibration purposes. Hence, the proposed A/D converter architecture of the disclosure is especially useful when performing calibration.

Although the proposed A/D converter allows for an advantageous way of calibrating, the A/D converter is evidently also arranged for performing A/D conversion in normal operation. To that end it comprises a search logic block arranged for receiving an output signal from the one or more comparators and for providing input to the DAC for generating the search signal. It also produces the digital output signal.

One aspect of the proposed solution is that the same DAC can be used for both the calibration and the normal operation. As a result, the calibration step of the ADC only requires a single reference voltage external to the ADC, rather than several. Since external references conventionally need to be generated using a dedicated DAC, the use of the internal DAC of an ADC to generate these reference voltages leads to an efficient implementation. However, contrary to many prior solutions, the DAC used in normal operation is assumed to be sufficiently linear at the start of the calibration step: its linearity cannot be improved or characterized during the calibration step.

In one embodiment, the circuitry adapted for generating a calibration signal comprises a plurality of capacitances. Alternatively a set of resistors can be employed.

In another embodiment the calibration logic block is arranged for compensating comparator offset. The offset is made digitally controllable, for example, by adding switchable capacitance in the comparators, and the calibration logic controls these comparator offset settings.

In yet another embodiment, the input voltage signal is a differential signal. However, the skilled person will readily appreciate that also a single-ended implementation can be envisaged.

In a further embodiment the search logic block is implemented as a successive approximation register.

The disclosure also relates to a converter circuit comprising an analogue-to-digital converter as previously described and supplementary conversion means for quantizing the difference between the input voltage signal of the analogue-to-digital converter and the digital output signal.

The converter circuit further comprises amplifier means arranged for amplifying the difference and for being calibrated by the calibration logic block.

In another aspect, the disclosure relates to a method for calibrating an analogue-to-digital converter. The method includes sampling an input voltage signal applied to the analogue-to-digital converter and generating a control signal and switching, according to the control signal, circuitry in a digital-to-analogue converter provided in the analogue-to-digital converter, whereby a calibration signal is generated based on the control signal and the sampled input voltage signal. The method also includes applying the calibration signal to a comparator in the analogue-to-digital converter, observing a digital output signal of the analogue-to-digital converter and comparing that output signal with a desired output signal, and adjusting an analogue non-ideality of the analogue-to-digital converter according to the result of the comparing.

In the proposed method an internal D/A converter of the analogue-to-digital converter is employed for generating a calibration reference signal based on the sample input voltage signal and the control signal.

Certain objects and advantages may become apparent from the present disclosure. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, in which:

FIG. 6(a) illustrates operation during calibration and FIG. 6(b) during normal A/D conversion operation.

DETAILED DESCRIPTION

Figure 1:
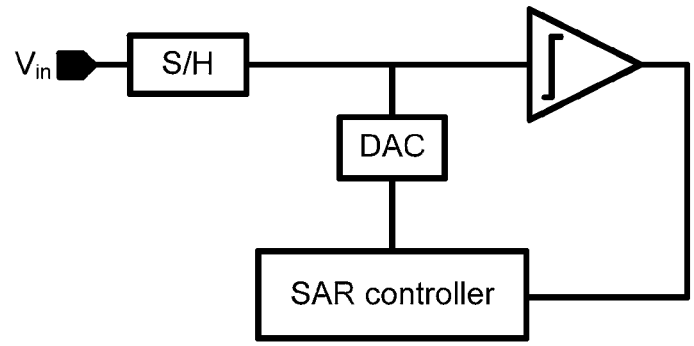
FIG. 1 represents a conventional successive approximation register (SAR) ADC scheme.
Figure 2:
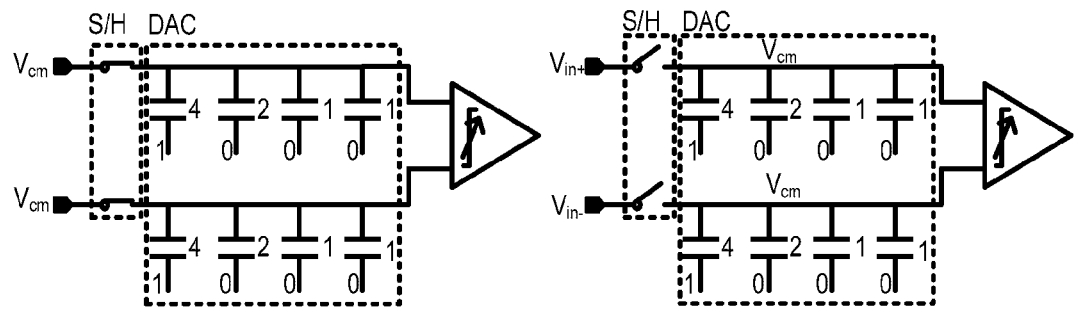
FIG. 2 represents an example of comparator offset calibration in a differential SAR ADC.
Figure 3:
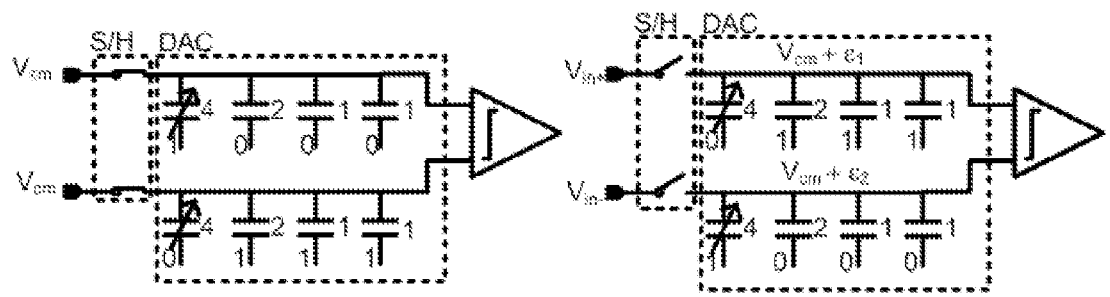
FIG. 3 represents an example of DAC MSB calibration in a differential SAR ADC.
Figure 4:
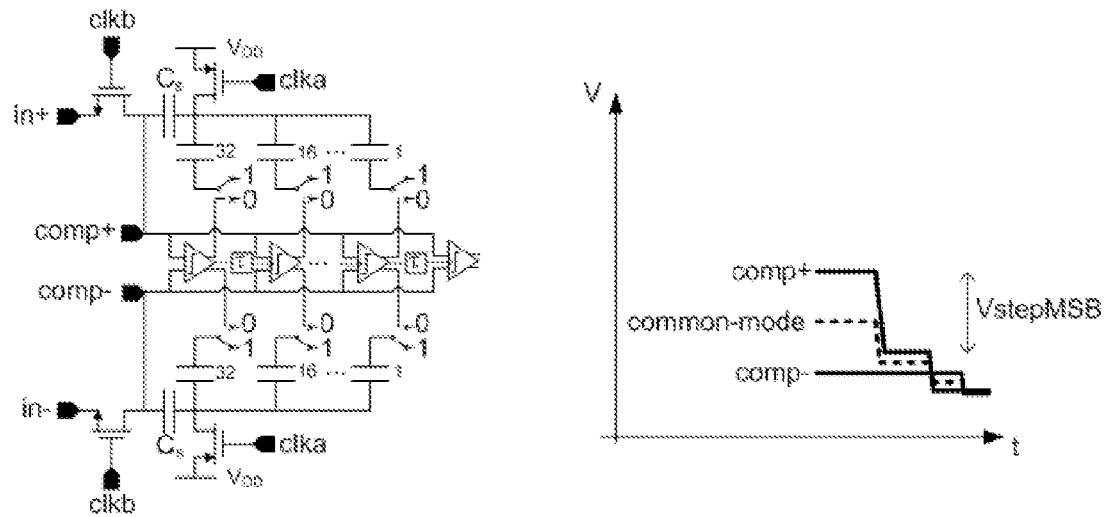
FIG. 4 represents a SAR ADC implementation (left) and voltage waveforms (right) as known in the art.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Figure 5:
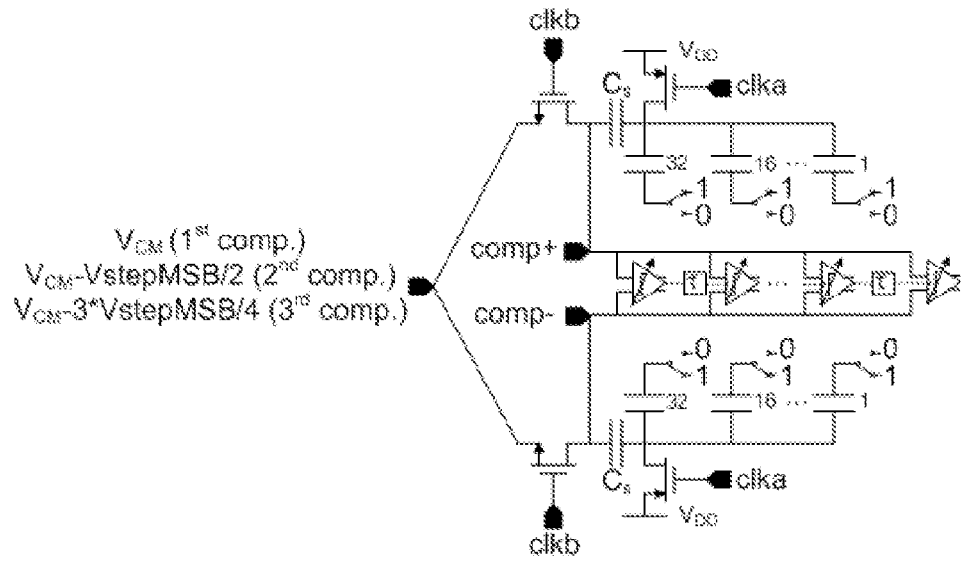
FIG. 5 illustrates the problem of conventional comparator offset calibration, which requires multiple common-mode inputs.
Figure 6:
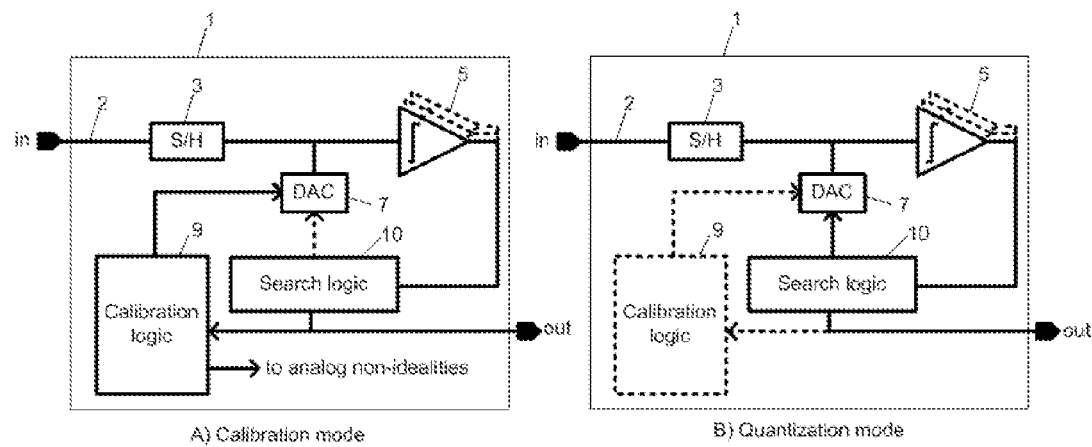
FIG. 6 represents a general block scheme of an A/D converter according to the present disclosure.

FIG. 6 shows a general block scheme of an embodiment of the disclosure. The disclosure proposes using the internal DAC (7) of the SAR ADC to generate the required calibration voltages, so that the overhead of a dedicated calibration DAC as in FIG. 5 is avoided. FIG. 6A illustrates the operation of the A/D converter during calibration phase. The calibration logic block generates a control signal to control circuitry (not shown) in the DAC, as detailed below. The circuitry in the DAC creates a calibration signal to be applied to a comparator, whereby the control signal and the sampled input signal are taken into account. By monitoring some or all of the digital outputs of the ADC with this calibration signal as an input, and comparing these with a desired output, the calibration logic can then reduce the impact of some analog non-idealities through digital control. FIG. 6B illustrates the normal operation of the A/D converter. The calibration logic block is no longer used. The search logic block receives comparator outputs and performs some search algorithm to adjust the control signals so that the compared voltages are narrowed.

Figure 7:
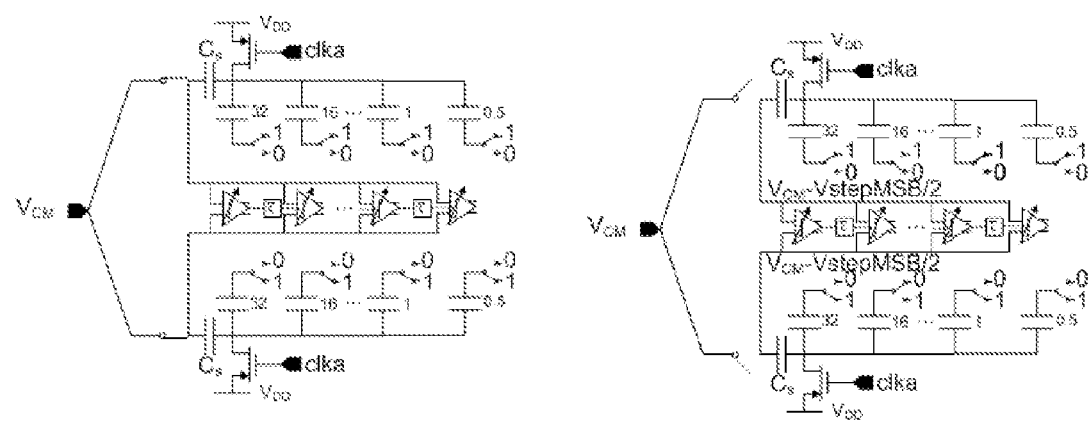
FIG. 7 represents an embodiment of an A/D converter according to the disclosure.

The above arrangement can be used to avoid the dedicated calibration DAC required in FIG. 5. As illustrated in FIG. 7, first the ADC samples a zero differential input voltage at a common-mode voltage $V_{cm}$. Since this is the correct common-mode voltage for the first comparator, its output can be used to infer and correct for the first comparator offset without additional DAC switching. To calibrate the second comparator offset, rather than sampling a zero differential input at a common-mode of $V_{cm}$–VstepMSB/2 as mentioned above, the $V_{cm}$ common-mode, zero differential reference used also for the first comparator is sampled. After sampling, however, both the positive and negative MSB-1 DAC capacitances are switched from reference to ground, reducing both comparator inputs by VstepMSB/2 as illustrated in FIG. 7. As a result, the common-mode comparator input is reduced by VstepMSB/2 without a change in the differential comparator input. The output of the second comparator can then be observed and offset can be inferred and minimized. For the third comparator offset, the same $V_{cm}$ common-mode reference signal is used, but all MSB-1 and MSB-2 units are switched from reference to ground, lowering the common-mode voltage by 3*VstepMSB/4. All subsequent comparators can be similarly calibrated.

In the proposed arrangement all comparator offsets can be calibrated using a single external reference of a zero differential voltage at $V_{cm}$ common-mode, which does not require significant dedicated circuitry to generate calibration reference signals. The core ADC must be slightly modified to switch the DAC based on some digital reference signals rather than the comparator outputs. This requires only a change in the digital signal path of the SAR ADC. In addition, to correctly set the common-mode input voltage for the last comparator, a half LSB unit must be added to the DAC array. Indeed, during normal operation, the final comparator common-mode voltage is $V_{cm}$–VstepMSB/2–VstepMSB/4– . . . –VstepLSB/2. The final common-mode shift of VstepLSB/2, which is in normal operation the result of a single ended discharge of VstepLSB, requires two differential half LSB units to reproduce during calibration without changing the differential mode of the comparator inputs.

Figure 8:
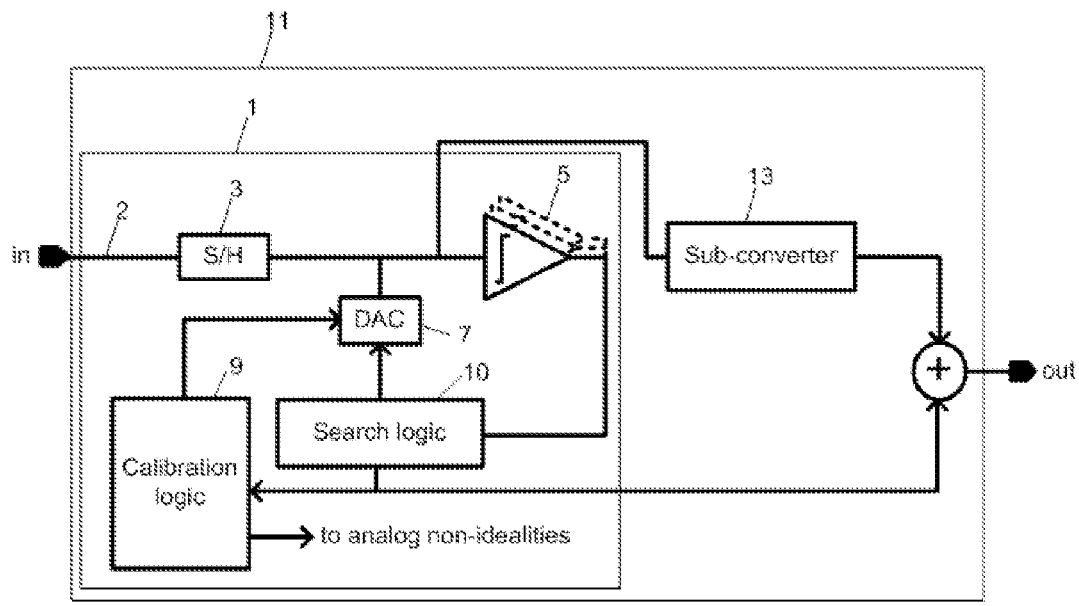
FIG. 8 represents a converter circuit with a first stage SAR ADC and a subconverter for quantizing the residue of the first stage.

The proposed arrangement further allows for the calibration of other analogue non-idealities. FIG. 8 illustrates a converter circuit (11) with a first stage SAR ADC (1) and a sub-converter (13) arranged for quantizing the residue of the first stage conversion. With 'residue' is meant the difference between the analogue input voltage signal and a signal represented by the digital output of the SAR ADC output.

In this arrangement the first stage DAC can be used to apply a reference input signal for calibration of the sub-converter. For example, applying the above-described approach the gain of a residue amplifier can be calibrated. For this purpose a non-zero differential signal of an appropriate common-mode is required. Note that these would conventionally also need to be generated using a specific calibration DAC. By properly choosing different reference signals for the positive and negative sides of the differential SAR DAC, these references can also be generated without a dedicated calibration DAC.

This example can also be used to calibrate the flash quantizer in a conventional pipeline converter. For example, consider a 1.5 b pipeline stage with two comparators that compare the input voltage $V_{in}$ with thresholds at $+V_{ref}/2$ and $-V_{ref}/2$. In normal operation the feedback DAC would either add $V_{ref}$ to the input if $V_{in} < -V_{ref}/2$ or subtract $V_{ref}$ from the input if $V_{in} > V_{ref}/2$. With a small modification to the feedback DAC, a zero differential external reference can be used to calibrate both comparator thresholds. To this end, the DAC should be split into two half units, thereby increasing its resolution without increasing its accuracy.

To calibrate the comparator threshold at $+V_{ref}/2$, first the zero differential external reference is sampled. Next the calibration logic is arranged to switch the feedback DAC in such a way that it increases the comparator input voltage by $V_{ref}/2$. Finally, the comparator is clocked and its output probability is compared to the desired 50% positive, 50% negative distribution and the comparator threshold is adjusted to approximate this desired distribution. The comparator threshold at $-V_{ref}/2$ is calibrated in a similar way.

The proposed arrangement avoids the need for external references at $+V_{ref}/2$ and $-V_{ref}/2$, and allows flash quantizer calibration with a single zero differential input. The same approach can be extended to higher resolution flash quantizers, with even greater reduction in the required number of external references.

Figure 9:
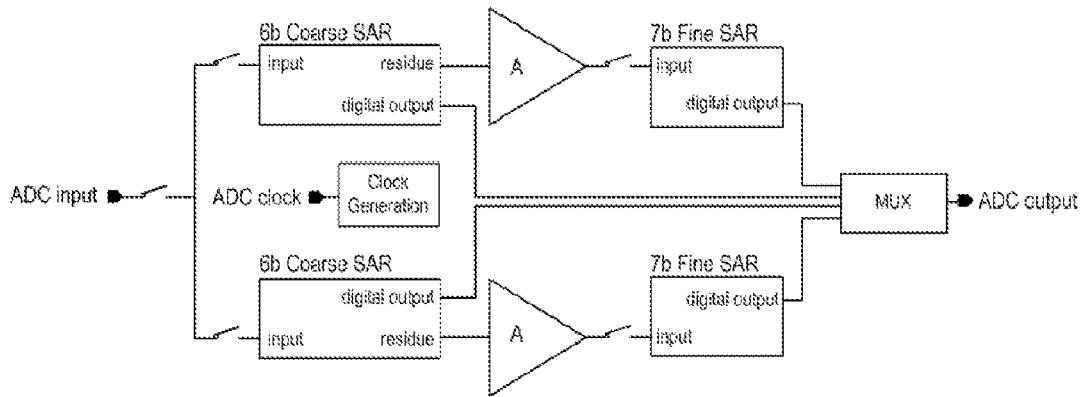
FIG. 9 represents a block diagram of a pipelined SAR ADC according an embodiment of the disclosure.

By way of example, a more detailed implementation will now be presented of a fully dynamic, two-times interleaved pipelined SAR ADC, wherein the calibration solution as described above is applicable. FIG. 9 shows a block diagram of an A/D converter comprising a bootstrapped front-end sampling switch operating at the full clock frequency, two identical ADC channels operable at half the clock rate and opposite phase and a multiplexer combining the outputs of the two channels. The front-end sampling switch uses a 50% duty cycle and turns off first, eliminating potential timing mismatch between the two channels. Each channel consists of a 6 b coarse SAR ADC, a dynamic residue amplifier with a sampling switch at its output and a 7 b fine SAR ADC to quantize this residue. Since two factor 2 redundancies are implemented, the converter has 11 b quantization noise.

Figure 10:
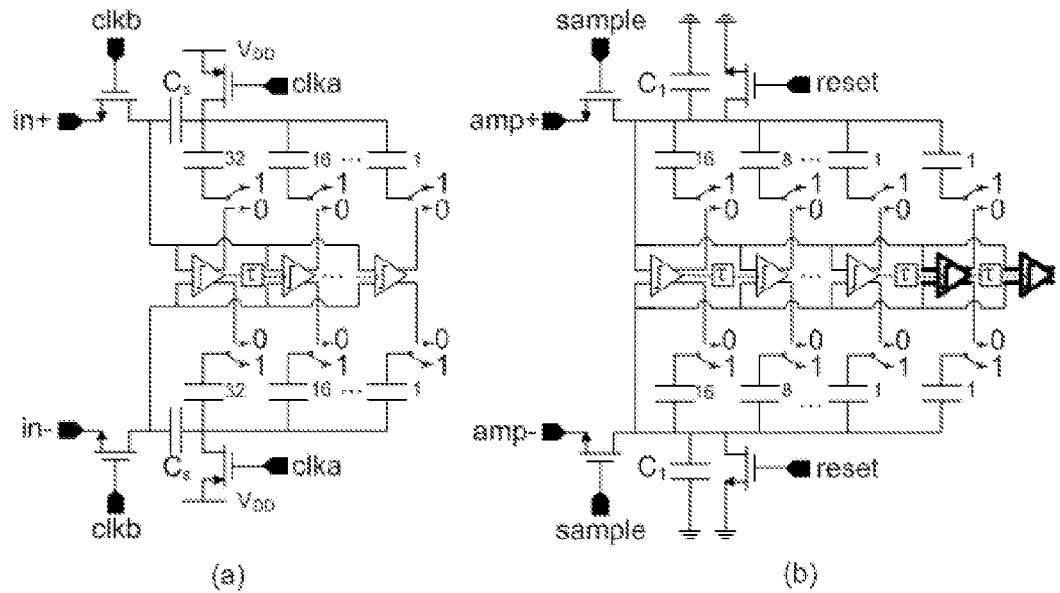
FIG. 10 represents a simplified architecture of the coarse SAR stage (a) and the fine SAR stage (b) shown in FIG. 9.

FIG. 10a shows the implementation of the coarse SAR ADC. It is implemented with a step-down DAC and the comparators themselves implementing the controller: each cycle of the SAR ADC has its own dynamic comparator that is clocked in sequence by the preceding comparator, with an appropriate delay to allow for DAC settling. The comparators have their offsets calibrated offline using digitally controllable capacitance. Since each comparator is only clocked once in a specific cycle the changing common-mode of the chosen DAC is not an issue. In the coarse SAR, a series sampling capacitance ($C_s$) of 1 pF is used to reduce the input capacitance by a factor 2 compared to the DAC capacitance of 2 pF. The bottom plate of this sampling capacitance is tied to $V_{DD}$ during sampling, and then discharged by the DAC during the SAR algorithm. To correct for DAC capacitor mismatch and gain errors between the two interleaved channels, digital calibration is added for the MSB capacitance and top plate DAC capacitance respectively. After the coarse SAR has finished, the residue of this conversion is conveniently available at its comparator inputs.

Figure 11:
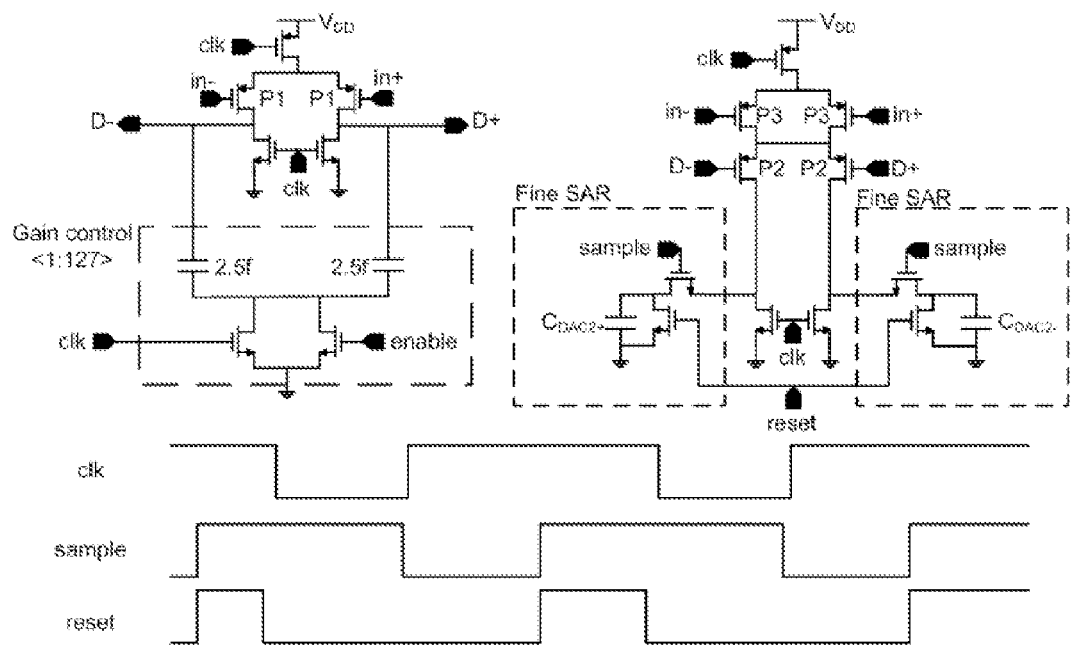
FIG. 11 represents a schematic of the dynamic residue amplifier and clock waveforms for this amplifier and the fine SAR.

The amplification of this residue is implemented using a dynamic amplifier as shown in FIG. 11. During the coarse SAR operation the amplifier clock is high and the amplifier is in reset mode. The sample and reset signals controlling the fine SAR are asynchronously brought high when the fine SAR is ready to receive the next amplified residue or when the coarse SAR is nearly done, whichever occurs first in a given clock cycle. When the first stage has generated its residue, the reset signal and amplifier clock are brought low, and the D+ and D− nodes are charged from ground up to $V_{DD}$ with speeds depending on the in+ and in− voltages. During this charging operation, current flows through the P3, P2 and sampling transistors into the fine SAR DAC capacitance ($C_{DAC2}$), building up a voltage on these nodes. When the D+ and D− nodes reach $V_{DD}$ the P2 transistors turn off, stopping all current flow in the amplifier and freezing the amplifier output voltage. At this point the sampling signal is brought low, disconnecting the fine SAR from the amplifier. The amplifier is then reset such that the coarse SAR can start processing the next sample while the fine SAR starts quantizing the sampled residue, i.e. both stages are pipelined.

The P3 transistors in FIG. 11 implement common-mode feed-forward, reducing the common-mode gain of the amplifier. When the input common-mode increases, D+ and D− are charged slower and the P2 transistors are on for a longer time, which results in higher common-mode output voltage. The P3 transistors counter this trend by decreasing the current through the P2 transistors when the input common-mode increases. The amplifier gain is controlled with a 7 bit gain control unit. By leaving the bottom plate of the 2.5 fF capacitance units floating during the critical charging of D+ and D− rather than permanently connecting it to ground, the slope of D+ and D− can be increased, thus decreasing the amplifier gain. To guarantee sufficient (>6 b) linearity in this amplifier the output range is kept limited to roughly 100 mV$_{pp}$ differential. The amplifier is designed for a voltage gain of approximately 4. During an offline calibration, the amplifier gain is tuned such that 1 LSB of the coarse stage corresponds to 1 MSB of the fine stage. Since the total range of the second stage is then twice the size of the first stage LSB, this results in a factor 2-redundancy, which can correct for settling errors in the first stage. By matching the bit weights of the two stages their outputs can be combined using a simple shift and add operation, without digital multipliers.

FIG. 10(b) shows the implementation of the fine SAR. Similar to the coarse SAR, a step-down DAC directly controlled by comparators is used. However, since the DAC capacitance required for sufficient matching is very small, no series sampling capacitance is used. Rather, a fixed capacitance to ground (C1) is added to reduce the DAC range and lower the sampled noise. The total size of the fine SAR DAC capacitance is 62 fF, limited by the size of a unit capacitance, while C1 is roughly 600 fF. To compensate for errors due to comparator noise the 5th and 6th comparison generate the same weight feedback, resulting in a factor 2 redundancy between these decisions. The 6th and 7th comparators are implemented with lower noise and lower speed, as shown in bold in FIG. 10(b).

A two step, shorted input off-line calibration procedure as described above is used to tune comparator offset and residue amplifier gain, in that order. A zero differential input signal at the ADC common-mode is transformed into a zero signal of the correct common-mode at the input of a comparator by directly controlling the internal DACs, and comparator offset is calibrated by observing the average output of these comparators. This is repeated 13 times for all comparators in the ADC. To correctly set the common-mode input for the last comparator of the coarse SAR, a half LSB unit must be added to the DAC array. Indeed, during normal operation, the final comparator common-mode voltage is half an LSB lower than the previous comparators, which is in normal operation the result of a single ended discharge of 1 LSB. To reproduce this step in calibration without changing the differential mode the DAC requires two differential half LSB units. Next, the same zero differential input at the ADC common-mode is transformed into a ±0.5 LSB differential signal by direct control of the coarse DAC, and the amplifier gain can be calibrated by measuring its output using the second stage.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. An analogue-to-digital converter for converting an input voltage signal into a digital output signal representing the input voltage signal, the analogue-to-digital converter, comprising:
a sample and hold circuit configured to sample the input voltage signal;
one or more comparators configured to receive the sampled input voltage signal;
a digital-to-analogue converter (DAC), wherein the same DAC is configured to operate in a calibration mode and a distinct quantization mode, wherein the DAC is configured to generate a calibration signal when operating in the calibration mode, and to generate a search signal when operating in the quantization mode, wherein the search signal approximates the input voltage signal, and wherein the DAC is configured to apply the calibration signal to the one or more comparators when operating in the calibration mode and to apply the search signal to the one or more comparators when operating in the quantization mode;

a search logic block configured to receive a comparator output signal from the one or more comparators, to produce the digital output signal, and to execute a search algorithm on the comparator output signal and accordingly provide an input to the DAC for generating the search signal when the DAC is operating in the quantization mode; and a calibration logic block configured to produce a control signal to control the DAC when the DAC is operating in the calibration mode, to observe the digital output signal, to compare the digital output signal with a desired output, and to compensate for analogue non-idealities of the analogue-to-digital converter, according to a result of the comparison, to thereby reduce a difference between the digital output signal and the desired output, and wherein the calibration logic block is configured not to produce the control signal when the DAC is operating in the quantization mode, wherein the DAC is adapted to generate the calibration signal in accordance with the control signal and with the sampled input voltage signal.

2. The analogue-to-digital converter as in claim 1, wherein the DAC includes a plurality of capacitances that are configured to generate the calibration signal and the search signal.

3. The analogue-to-digital converter as in claim 2, wherein the calibration logic block is configured to compensate for comparator offset.

4. The analogue-to-digital converter as in claim 1, wherein the input voltage signal is differential.

5. The analogue-to-digital converter as in claim 1, wherein the search logic block is implemented as a successive approximation register.

6. A converter circuit comprising an analogue-to-digital converter as in claim 1 and a supplementary converter circuit configured to quantize a difference between the input voltage signal and the digital output signal of the analogue-to-digital converter.

7. The converter circuit as in claim 6, further comprising an amplifier configured to amplify the difference between the input voltage signal and the digital output signal of the analogue-to-digital converter and configured to be calibrated by the calibration logic block.

8. The analogue-to-digital converter as in claim 1, wherein the DAC is a single DAC that is configured to generate the calibration signal when operating in the calibration mode, and to generate the search signal when operating in the quantization mode.

9. A method for operating an analogue-to-digital converter comprising:

sampling an input voltage signal applied to the analogue-to-digital converter;

operating the analogue-to-digital converter in a calibration mode and a distinct quantization mode;

wherein operating the analogue-to-digital converter in the calibration mode includes:
generating, by a calibration logic block, a control signal;
switching, according to the control signal, a digital-to-analogue converter (DAC) to generate a calibration signal based on the control signal and the sampled input voltage signal, wherein the DAC is provided in the analogue-to-digital converter;
applying the calibration signal to a comparator in the analogue-to-digital converter;
observing a digital output signal of the analogue-to-digital converter and comparing the digital output signal with a desired output signal; and
adjusting an analogue non-ideality of the analogue-to-digital converter according to a result of the comparison;

wherein operating the analogue-to-digital converter in the quantization mode includes:
generating, by the same DAC, a search signal that approximates the input voltage signal;
applying the search signal to the comparator in the analogue-to-digital converter; and
executing a search algorithm on an output signal of the comparator that is based at least in part on the applied search signal,
wherein the DAC generates a subsequent search signal based at least in part on a result of the executed search algorithm, and wherein the calibration logic block is configured not to generate the control signal when the analogue-to-digital converter is operating in the quantization mode.

10. The method of claim 9, wherein the DAC is a single DAC that generates the calibration signal when the analogue-to-digital converter is operating in the calibration mode, and that generates the search signal when the analogue-to-digital converter is operating in the quantization mode.

* * * * *